United States Patent [19]

Yamazaki et al.

[11] Patent Number: 4,975,050
[45] Date of Patent: Dec. 4, 1990

[54] WORKPIECE HEATING AND FEEDING DEVICE

[75] Inventors: Nobuto Yamazaki; Hiroshi Ushiki; Kenji Kitakubo, all of Tachikawa, Japan

[73] Assignee: Kabushiki Kaisha Shinkawa, Tokyo, Japan

[21] Appl. No.: 374,533

[22] Filed: Jun. 30, 1989

[30] Foreign Application Priority Data

Jul. 4, 1988 [JP] Japan .................................. 63-166544

[51] Int. Cl.⁵ ............................ F27D 3/00; B23K 3/00
[52] U.S. Cl. .................................... 432/250; 432/239; 228/105
[58] Field of Search ................ 432/239, 250; 228/4.5; 414/156, 198

[56] References Cited

U.S. PATENT DOCUMENTS

| | | | |
|---|---|---|---|
| 3,800,716 | 4/1974 | Berger | 432/250 X |
| 3,859,041 | 1/1975 | Winslow | 432/250 |
| 3,900,145 | 8/1975 | Diepeveen | 228/4.5 X |
| 3,980,028 | 9/1976 | Ginsburg | 432/250 X |
| 4,732,313 | 3/1988 | Kobayashi et al. | 228/4.5 X |
| 4,763,826 | 8/1988 | Kulicke, Jr. et al. | 228/4.5 |
| 4,765,531 | 8/1988 | Ricketson et al. | 228/4.5 X |
| 4,855,007 | 8/1989 | Baxter et al. | 228/103 X |

FOREIGN PATENT DOCUMENTS 0045040  4/1981  Japan ................................... 228/904

Primary Examiner—Henry A. Bennet
Assistant Examiner—C. Kilner
Attorney, Agent, or Firm—Koda & Androlia

[57] ABSTRACT

A workpiece heating and feeding device having a lid which is installed above a heating block which heats the workpieces, the lid having an opening formed in the central portion thereof wherein a transparent heat-resistant plate covers the opening in the lid. The lid may alternately be entirely made of a heat-resistant material. Since the heating block is covered, no dirt or dust can enter the interior of the device. In addition, since the lid has either a transparent plate or is itself made of a transparent heat-resistant material, working conditions can easily be monitored and adjustments to the feeding of the workpiece facilitated.

2 Claims, 3 Drawing Sheets

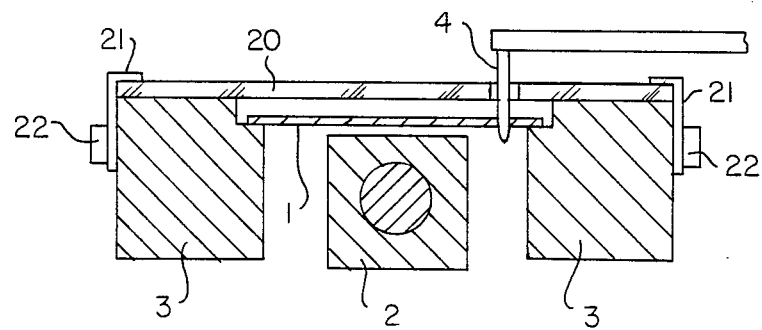
FIG. 2
FIG. 3 PRIOR ART
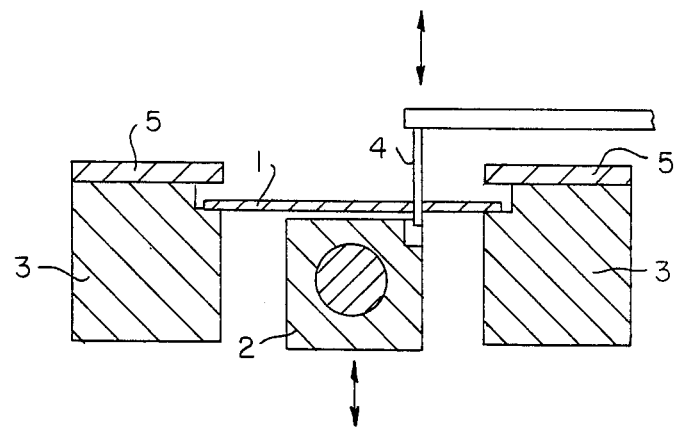

WORKPIECE HEATING AND FEEDING DEVICE

BACKGROUND OF THE INVENTION

1. Field of the Invention

The present invention relates to a workpiece heating and feeding device which can be used in wire bonders, die bonders or curing devices that are used in the manufacture of semiconductor devices.

2. Prior Art

Conventionally, workpiece heating and feeding devices used in bonders, for example, consist of three general types. The three types are (a) devices in which the area above the heating block that heats the workpieces (e.g. the lead frames, etc.) is open (as shown in FIG. 3), (b) devices in which the area above the heating block is closed (as shown in FIG. 4) or (c) devices in which the entire periphery of the heating block is sealed off (as shown in FIG. 5).

The device shown in FIG. 3 (wherein the area above the heating block is open) is the most common type of device used. In this device, a split lid 5 is fastened to guide rails 3 which guide the workpieces 1, so that the workpieces 1 will not float upward as they are fed by the feeding claws 4. In other words, nothing is installed above the central portions of the workpieces 1 portions of the workpieces are left exposed.

Such a device operates in the following manner. With the heating block 2 in a lowered position, the feeding claws 4 are caused to complete a cycle in which the claws 4 are lowered and, caused to complete a forward motion in the horizontal direction (perpendicular to the plane of the paper as shown in FIG. 3), raised and caused to complete a return motion in the horizontal direction. As a result of this cycle, the workpieces 1 are fed by one pitch. After the movement of the feeding claws 4 stops, the heating block 2 is raised, so that each workpiece is heated.

The device illustrated in FIG. 4 (wherein the area above the heating block is closed) is used in cases where the workpieces 1 or leads formed on the workpieces 1 consist of materials which are easily oxidizable such as copper materials. In this device, as shown in FIG. 4, the heating block 2 is arranged so that it guides the workpieces 1, and an integral lid (that is, a lid consisting of one piece) made of iron is fastened to the heating block 2 itself. Grooves 2a are formed in the upper surface of the heating block 2, and the pipes 6 are installed in these grooves 2a so that the pipes can move upward and downward. The system is arranged so that an inert gas may be introduced and caused to flow over the upper surface of the heating block 2 from the pipes 6.

This device operates as follows: After the pipes 6 are raised so that the workpieces 1 are caused to float above the heating block 2, each workpiece 1 is fed a distance of one pitch by the feeding claws 4. Afterward, the pipes 6 are lowered so that the workpieces 1 rest on the surface of the heating block 2 and the workpieces 1 are thus heated. As a result of the inert gas flowing from the pipes 6, the area above the heating block 2 is filled with an inert gas thus preventing oxidation of the workpieces 1.

The device illustrated in FIG. 5 also prevents oxidation of the workpieces in the same manner as the device illustrated in FIG. 4. Specifically, in this device, an integral lid 5 (that is, a one piece lid) made of iron is fastened to the upper surface of a housing 7 which guides the workpieces 1 so that the lid 5 covers the heating block 2. Holes 2b which allow the flow of insert gas are formed in the heating block 2 parallel to the feeding direction of the workpiece 1. These holes 2b are connected with the upper surface of the heating block 2 by holes 2c. A gas atmosphere is created above the heating block 2 by causing insert gas to flow through the holes 2b from gas supplying ports (not shown). The heating block 2 is arranged so that it can be driven upward and downward. As in the case of the device illustrated in FIG. 3, the heating block 2 is lowered while the workpieces 1 are being fed. After the workpieces 1 have been fed, the heating block 2 is raised, and the workpieces 1 are heated.

It goes without saying that a bonding window is formed in a portion of the lid 5 which corresponds to the position of the bonding tool in the devices shown in FIGS. 4 and 5.

While the above described prior art devices are in general use, they have possess certain disadvantages. In the case of the device shown in FIG. 3 (the open device), since the central portions of the workpieces are exposed, dust and dirt may enter from above and adhere to the workpieces. Such dust and dirt has a deleterious effect on the bonding process.

In the devices shown in FIGS. 4 and 5, since the devices are covered by an iron lid 5, the interior thereof cannot be seen. As a result, observation of oxidation caused discoloration, adjustment of feeding of the workpiece and maintenance of the device are difficult.

SUMMARY OF THE INVENTION

In view of the above described prior art, it is an object of the present invention to provide a workpiece heating and feeding device which does not allow dust or dirt to enter the device.

It is another object of the present invention to provide a device wherein the condition of the workpieces can be readily observed so as to effect easy adjustment and maintenance of the device.

The above objects are achieved in the following manner. The present invention provides a workpiece heating and feeding device in which a lid is installed above a heating block that heats the workpiece. In addition, an opening is formed in the central portion of the lid and a transparent heat-resistant plate is attached so that the plate covers the opening.

Alternately, the objects of the present invention can be achieved by making the lid covering the heating block of a transparent heat-resistant plate.

Thus in the present invention, since the area above the heating block is covered by a lid and a transparent heat-resistant plate, penetration of dirt and dust into the interior of the device is prevented.

In addition, since the workpieces can be viewed via the transparent heat-resistant plate, the condition of the workpieces can be monitored. Thus, adjustment of the feeding rate of the workpieces and maintenance of the device can be readily facilitated.

BRIEF DESCRIPTION OF THE DRAWINGS

FIG. 2 is a cross-sectional view illustrating another embodiment of the present invention; and FIGS. 3, 4 and 5 are cross-sectional views of conventional workpiece heating and feeding devices.

DETAILED DESCRIPTION OF THE INVENTION

Figure 1A:
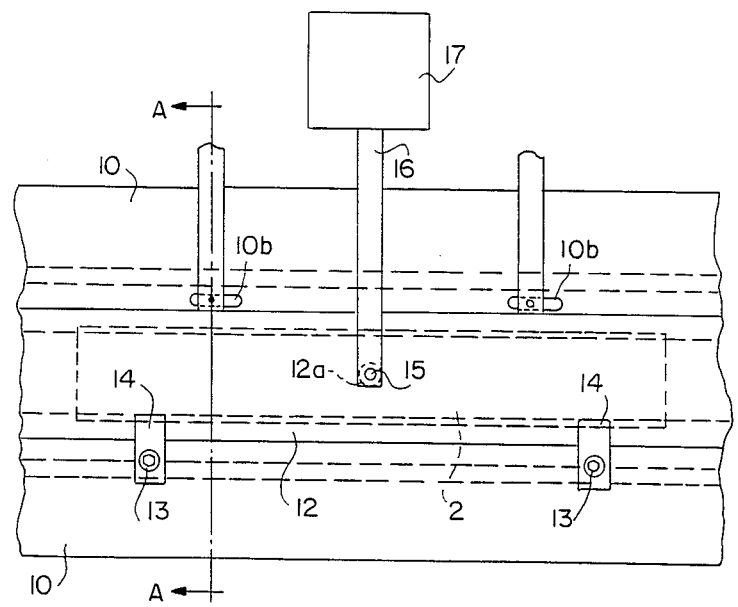
FIG. 1(a) is a plan view of one embodiment of the present invention.
Figure 1B:
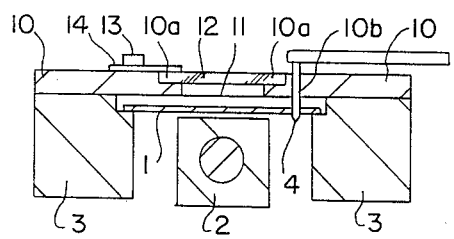
FIG. 1(b) is a cross-sectional view taken along the line A—A of FIG. 1(a)

Given below is a detailed description of the present invention. Referring to FIGS. 1(a) and 1(b), the embodiment shown therein is an open type device (as shown in FIG. 3 of the prior art). In FIGS. 1(a) and 1(b) elements which correspond to those elements of FIG. 3 are given the same reference numerals. A split lid 10 is fastened to the surfaces of guide rails 3 which guide the workpieces 1. Accordingly, an opening 11 is formed between the two parts of the split lid 10. Grooves 10a which support a heat-resistant plate 12 consisting of transparent heat-resistant glass are formed in the facing end portions of the two lid parts 10. The heat-resistant plate 12 is formed in the facing end portions of the two lid parts 10 and is tightly held in the grooves 10a by plate springs 14 which are fastened to the lid 10 by bolts 13. Claw escape holes 10b are formed in the lid 10 so that there is no interference with the movement of the feeding claws 4. In addition, a bonding window 12a is formed in the heat-resistant plate 12 in a position which corresponds to the position of the bonding tool 15.

The bonding tool 15 is attached to one end of a bonding arm 16. This bonding arm is pivotally attached (so that it is free to move upward and downward) to bonding head 17 which is fastened to an X-Y table (not shown in the Figures) that is driven in the X and Y directions. Furthermore, reference numeral 2 represents a heating block which is driven upward and downward.

In the present invention, feeding and heating of the workpiece is accomplished in the same way as described in the prior art. Accordingly, a description will be omitted herein.

Since the area above the heating block 2 is covered by the lid 10 and transparent heat-resistant plate 12, dirt and dust are prevented from penetrating into the interior of the device. Furthermore, since workpieces 1 can be viewed via the transparent heat-resistant plate 12, the condition of the workpieces 1 can be easily monitored and the feeding action of the workpieces 1 easily adjusted. Moreover, maintenance of the device can be easily accomplished by loosening the bolts 13 and removing the plate springs 14 and heat-resistant plate 12. If springs are inserted between the bolts 13 and plate springs 14, the plate springs 14 can be rotated without loosening the bolts 13, thus facilitating removal of the heat-resistant plate 12.

FIG. 2 illustrates another embodiment of the present invention. In this embodiment, the lid 20 itself consists of a transparent heat-resistant plate. In order to insure a tight fit against the surfaces of the guide rails 3, the lid 20 is fastened to the guide rails 3 by bolts 22 via L-shaped fastening parts 21. This structure produces the same effects as the embodiment shown in FIGS. 1(a) and 1(b).

Figure 4:
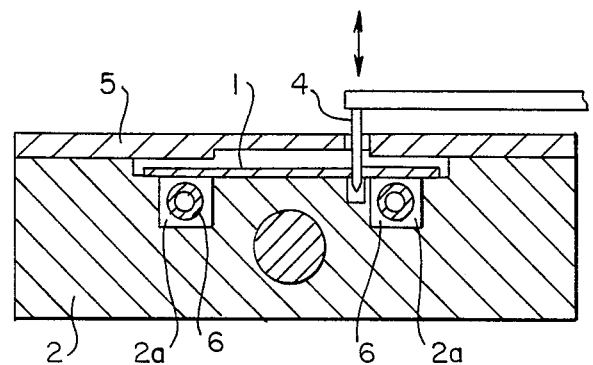
Figure 5:
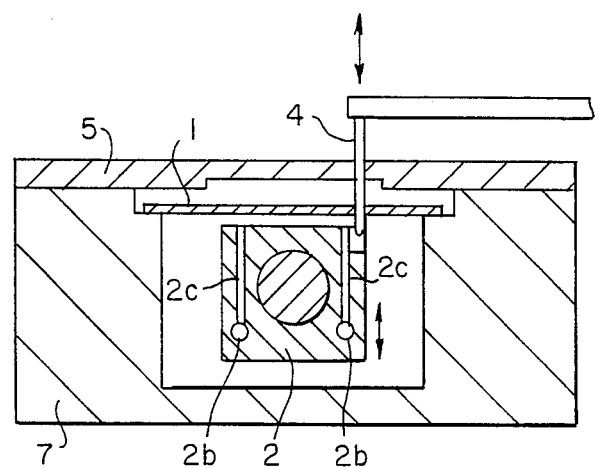

In both of the above described embodiments, the present invention is applied to a device such as that shown in FIG. 3. However, it goes without saying that it would also be possible to apply the present invention in a similar manner to the devices shown in FIGS. 4 and 5. Furthermore, the heat resistant plate 12 shown in FIGS. 1(a) and 1(b) and the lid shown in FIG. 2 were installed along the entire length of the workpiece feeding path, respectively; however, it would also be possible to install these parts along only a portion of the workpiece feeding path. Moreover, in the above described embodiments the present invention is to a bonder; however, it could also be applied to a curing device.

As should be clear from the above description, the present invention provides a workpiece heating and feeding device having an opening formed in the central portion of the heating block wherein a lid having a transparent heat-resistant plate attached thereto covers the opening. The lid may also be entirely made of a transparent heat-resistant material. Since the heating block is covered no dirt or dust can enter the interior of the device. In addition, since the lid has either a transparent plate attached to it or is itself made of a transparent heat-resistant material, working conditions can easily be monitored and adjustments to the feeding of the workpiece facilitated.

We claim:

1. A workpiece heating device for use in a bonder comprising;
    a pair of spaced apart guiderails for supporting a workpiece;
    a lid provided on said pair of guiderails and forming a chamber with said guiderails;
    a vertically reciprocal heating block provided in said chamber between said guiderails, said heating block vertically moving upward to engage with and heat said workpiece during bonding;
    at least a central opening provided in said lid above a bonding position of said bonder;
    a heat resistant transparent plate provided in said central opening;
    a hole provided in said transparent plate above said bonding position;
    a bonding tool extending through said hole, said bonding tool being coupled to a bonding head of said bonder;
    at least one elongated hole provided in said lid; and
    at least one workpiece feeding claw extending through said elongated hole for feeding said workpiece one pitch.

2. A workpiece heating and feeding device according to claim 1, wherein said transparent heat-resistant plate is made of heat-resistant glass.

* * * * *